United States Patent [19]

Hudak et al.

[11] Patent Number: 5,656,552
[45] Date of Patent: Aug. 12, 1997

[54] METHOD OF MAKING A THIN CONFORMAL HIGH-YIELDING MULTI-CHIP MODULE

[76] Inventors: John James Hudak, 5245 Hayledge Ct., Columbus, Md. 21045; David Jerome Mountain, 505 N. Chapelgate La., Baltimore, Md. 21229

[21] Appl. No.: 668,879

[22] Filed: Jun. 24, 1996

[51] Int. Cl.$^6$ .................. H01L 21/302; H01L 21/463
[52] U.S. Cl. .................. 438/15; 438/107; 438/459; 438/977
[58] Field of Search .................. 437/206, 207, 437/923, 974, 225, 228; 148/DIG. 150, DIG. 135; 257/668, 700

[56] References Cited

U.S. PATENT DOCUMENTS

| | | | |
|---|---|---|---|
| 5,075,253 | 12/1991 | Sliwa, Jr. | 437/209 |
| 5,144,747 | 9/1992 | Eichelberger | 29/839 |
| 5,324,687 | 6/1994 | Wojnarowski | 437/207 |
| 5,373,627 | 12/1994 | Grebe | 29/841 |
| 5,386,623 | 2/1995 | Okamoto et al. | 29/832 |
| 5,401,688 | 3/1995 | Yamaji et al. | 437/209 |
| 5,432,677 | 7/1995 | Mowatt et al. | 361/719 |
| 5,478,781 | 12/1995 | Bertin et al. | 437/209 |
| 5,517,754 | 5/1996 | Beilstein, Jr. et al. | 437/209 |

*Primary Examiner*—John Niebling
*Assistant Examiner*—Kevin F. Turner
*Attorney, Agent, or Firm*—Robert D. Morelli

[57] ABSTRACT

A method of making a multi-chip module by thinning individual integrated circuit die or an integrated circuit wafer containing multiple integrated circuits; bonding thinned dice or a thinned wafer to a mylar, polyimide, semiconductor, or ceramic substrate; depositing at least one interconnect material over the wafer, where the first interconnect layer is deposited directly over the wafer; depositing a dielectric layer over each of the interconnect layers; opening vias in the dielectric layers in order to interconnect the dice and multi-chip module as required; and removing the substrate to form a thin, conformal, and high-yielding multi-chip module.

48 Claims, 6 Drawing Sheets

METHOD OF MAKING A THIN CONFORMAL HIGH-YIELDING MULTI-CHIP MODULE

FIELD OF THE INVENTION

The present invention relates, in general, to semiconductor packaging and, in particular, to semiconductor packaging of a thin, conformal, and high-yielding multi-chip module.

BACKGROUND OF THE INVENTION

More and more the processing power is being required of all types of microelectronic modules and systems. A multi-chip module is a device that may provide the required processing power. A multi-chip module is a device containing a number of interconnected integrated circuits (i.e., dice) in one package. There are three types of multi-chip modules (i.e., laminate, ceramic, and deposition).

A laminate multi-chip module includes dice connected using various pre-fabricated laminate layers. A laminate multi-chip module can be conformal, but it may not be the smallest multi-chip module that can be made.

A ceramic multi-chip module includes dice on pre-fired (i.e., soft) ceramic tape known as "green tape." The combination is then fired to form a rigid device. The ceramic multi-chip module can be smaller than a laminate multi-chip module, but it is not conformal.

The last class of multi-chip module is a deposition multi-chip module. A deposition multi-chip module consists of standard-thickness dice placed on a supporting substrate. Since standard-thickness dice may form a surface topology that is too irregular to reliably accept a subsequent layer of interconnect, a planarization step is required to smooth the resulting irregular surface topology. There are at least three methods to planarize integrated circuits on a substrate. The first method is to place each die in its own well in the substrate and deposit a dielectric material in the remaining spaces in the wells. The second method is to place the dice onto a flat substrate, deposit a planarizing dielectric material over the dice and the substrate, and smooth the dielectric. The third method is to place the dice on a flat substrate and place a prefabricated stencil (commonly referred to as a window-frame) in the remaining spaces between the dice. A dielectric layer is deposited or laminated over the integrated circuits. Vias are cut into the dielectric in order to contact the dice. At least one thin-film interconnect layer is deposited over the dielectric layer. The deposition multi-chip module can be the smallest of the three classes of multi-chip modules, and if the multi-chip module is thinned after fabrication of the interconnect layers, it can be conformal as well.

Present laminate and deposition multi-chip modules suffer from at least five problems. The first problem is that standard-thickness dice are presently being used. The thinnest and most conformal multi-chip module cannot be realized using standard-thickness dice. The second problem is that a planarizing dielectric layer is deposited or laminated onto the dice prior to the deposition of the first interconnect layer. Again, the thinnest and most conformal multi-chip modules cannot be realized by using a planarizing dielectric layer between the dice and the first interconnect layer. The third problem, for those who attempt to thin the deposition multi-chip module after depositing the interconnect layers, is that the dice may be damaged during the thinning process and the manufacturing yield for the multi-chip module will suffer. There is presently no way of repairing a deposition multi-chip module after the interconnect layers have been deposited. Therefore, the manufacturing yield for the prior art methods of making thin conformal multi-chip modules is not as high as it could be. The fourth problem is that flexible multi-chip modules which use standard thickness (i.e., rigid and inflexible) dice separated by flexible interconnect must leave adequate space between dice so that bending of the interconnect can occur at these joints. Since the dice are standard thickness, bending occurs only at these joints. The space necessary for these joints is entirely eliminated by the present invention. The fifth problem is that flexible multi-chip modules which use standard thickness dice separated by flexible interconnect spaces cannot flex along an axis diagonal to the direction of the spaces. The flexibility of the thinned dice in the present invention allows flexibility in any direction. These five problems are corrected by the present invention.

U.S. Pat. No. 5,401,688, entitled "SEMICONDUCTOR DEVICE OF MULTICHIP MODULE-TYPE," discloses a laminate multi-chip module that uses standard thickness integrated circuits. U.S. Pat. No. 5,401,688 is hereby incorporated by reference into the specification of the present invention.

U.S. Pat. Nos. 5,432,677, entitled "MULTI-CHIP INTEGRATED CIRCUIT MODULE," and U.S. Pat. No. 5,386,623, entitled "PROCESS FOR MANUFACTURING A MULTI-CHIP MODULE, each disclose a method of making a deposition multi-chip module by placing each standard-thickness die into its own well in a substrate. These two patents do not result in a multi-chip module that is as thin or as conformal as a multi-chip module produced by the method of the present invention. U.S. Pat. Nos. 5,432,677 and 5,386,623 are hereby incorporated by reference into the specification of the present invention.

U.S. Pat. No. 5,373,627, entitled "METHOD OF FORMING MULTI-CHIP MODULE WITH HIGH DENSITY INTERCONNECTIONS," discloses a method of making a deposition multi-chip module where standard-thickness dice are placed on a dielectric layer deposited onto a flat substrate. The substrate is later removed, but even then, because of the remaining dielectric layer and the standard-thickness dice, the resulting multi-chip module is not as thin, conformal, or as high-yielding as a multi-chip module produced by the method of the present invention. U.S. Pat. No. 5,373,627 is hereby incorporated by reference into the specification of the present invention.

SUMMARY OF THE INVENTION

It is an object of the present invention to make a thin, conformal, and high-yielding multi-chip module.

It is another object of the present invention to make a thin, conformal, and high-yielding multi-chip module using thinned dice rather than standard-thickness dice.

It is another object of the present invention to make a thin, conformal, and high-yielding multi-chip module using dice that are thinned before placement into a multi-chip module rather than dice that are thinned after being placed in a multi-chip module.

It is another object of the present invention to make a thin, conformal, and high-yielding multi-chip module where at least one interconnect layer is put directly over thinned dice without the need for putting a dielectric layer between the thinned dice and the first layer of interconnect.

It is another object of the present invention to make a thin, conformal, and high-yielding multi-chip module where the supporting substrate is removed after at least one interconnect layer is put directly over thinned dice.

It is another object of the present invention to make a thin, conformal, and high yielding multi-chip module which achieves the property of mechanical flexibility by the purposeful flexing of the thinned dice.

The present invention is a method of making a thin, conformal, and high-yielding multi-chip module.

The first step in the method is to thin dice that will be used in the multi-chip module. Individual die, an entire wafer, or a segment of a wafer containing multiple integrated circuits may be thinned. The preferred method is to thin individual die so that high performance commercially available die may be obtained and included into a multi-chip module of the present invention. Anywhere die or dice are referred to in the present specification, a wafer or a segment of a wafer may be substituted. The dice are thinned to a thickness of less than or equal to 50 microns (i.e., 50 um). Experiments have shown that dice thinned to less than or equal to 50 um may be repeatedly flexed to small radii of curvature without failure. The method of thinning a die is (1) coat the top of die with a polyimide material; (2) cure the coated die at 80° C. for one minute to drive off solvents; (3) cure the die again at 350° C. for one hour in a vacuum; (4) bond a handle-wafer to the polyimide layer on the die using wax or an adhesive; (5) thin the die to a thickness less than or equal to 50 um from the bottom of the die using reactive ion etchants, wet chemical etchants, dry chemical etchants, mechanical grinding, or a combination thereof; and (6) melting the wax, dissolving the adhesive, or chemically etching away the handle wafer. A transfer wafer may be bonded to the die for transporting the thinned die and later released as above when the thinned die is ready to be used to make a multi-chip module.

The steps for thinning dice in quantity includes (1) bonding the dice face down to a flat supporting substrate in a registered fashion so that die that are not damaged during the thinning process may be functionally tested and positionally identified; (2) filling the gaps between the dice with a supporting filler material such as hard wax, epoxy, bis-benzocyclobutene (BCB) resin, polyimide, acrylic, or other such material which helps prevent edge chipping and cracking; (3) thinning the dice from the backside to a thickness of less than or equal to 50 um by using mechanical grinding, lapping, polishing, wet and/or dry chemical etching, sputter removal, or a combination thereof; (4) making electrical contact to the substrates of the dice as required; (5) bonding a second supporting substrate to the backs of the thinned dice to create a three layer stack; and (6) removing the first substrate by mechanical grinding, lapping, polishing, wet and/or dry chemical etching, sputter removal, using release layers, or a combination thereof.

The second step in the method is to test the thinned dice in order to identify good die. This step provides a significant yield improvement over the prior art. The prior art starts with known good standard-thickness dice, builds the multi-chip module, and thins the multi-chip module. It is likely that some die will be damaged during the thinning process. Therefore, the prior art method will result in less than 100% multi-chip module yield. In the present method, the dice are thinned prior to being built into a multi-chip module. Therefore, the present invention may achieve a 100% multi-chip module yield if no other defect occurs.

The third step in the method is to bond the thinned dice to a substrate in a registered fashion so that the pads on the dice are in alignment with at least one subsequent interconnect layer.

The fourth step in the method is to put a first interconnect layer directly over the dice. The interconnect layer may be deposited, laser formed, or laminated onto the dice. An adhesive may be used to attach the laminate layers. The present invention eliminates a planarization step that prior art methods include.

The fifth step is to deposit, laminate, or laser form a dielectric layer over the first layer of thin-film interconnect. An adhesive may be used to attach the laminate layers.

The sixth step is to open vias in the dielectric layer so that the first interconnect layer may be contacted. Steps four, five and six are repeated for each additional interconnect layer required. The top layer of via openings allows the multi-chip module to be contacted.

The final step is to remove the substrate on which the thinned dice are bonded.

The resulting multi-chip module is thinner, more conformal, and higher yielding than a multi-chip module produced by the prior art methods.

In an alternate embodiment, dielectric spacers (i.e., dielectric material formed at the edge of the dice) may be used to reduce failures due to poor step coverage by the interconnect layer. Dielectric spacers are formed by putting a dielectric material over the dice prior to putting an interconnect layer down. The dielectric layer is then etched back to the surface of the dice. Dielectric material remains at the edges of the dice, reducing the sharp angle at the each edge of the dice. An interconnect layer put down on the dice and the spacers will experience fewer step coverage failures due to the gentler slop at the edges of the dice. The dice may also be butted together. Furthermore, the dice may overlap each other for even denser packing.

DETAILED DESCRIPTION

Figure 1:
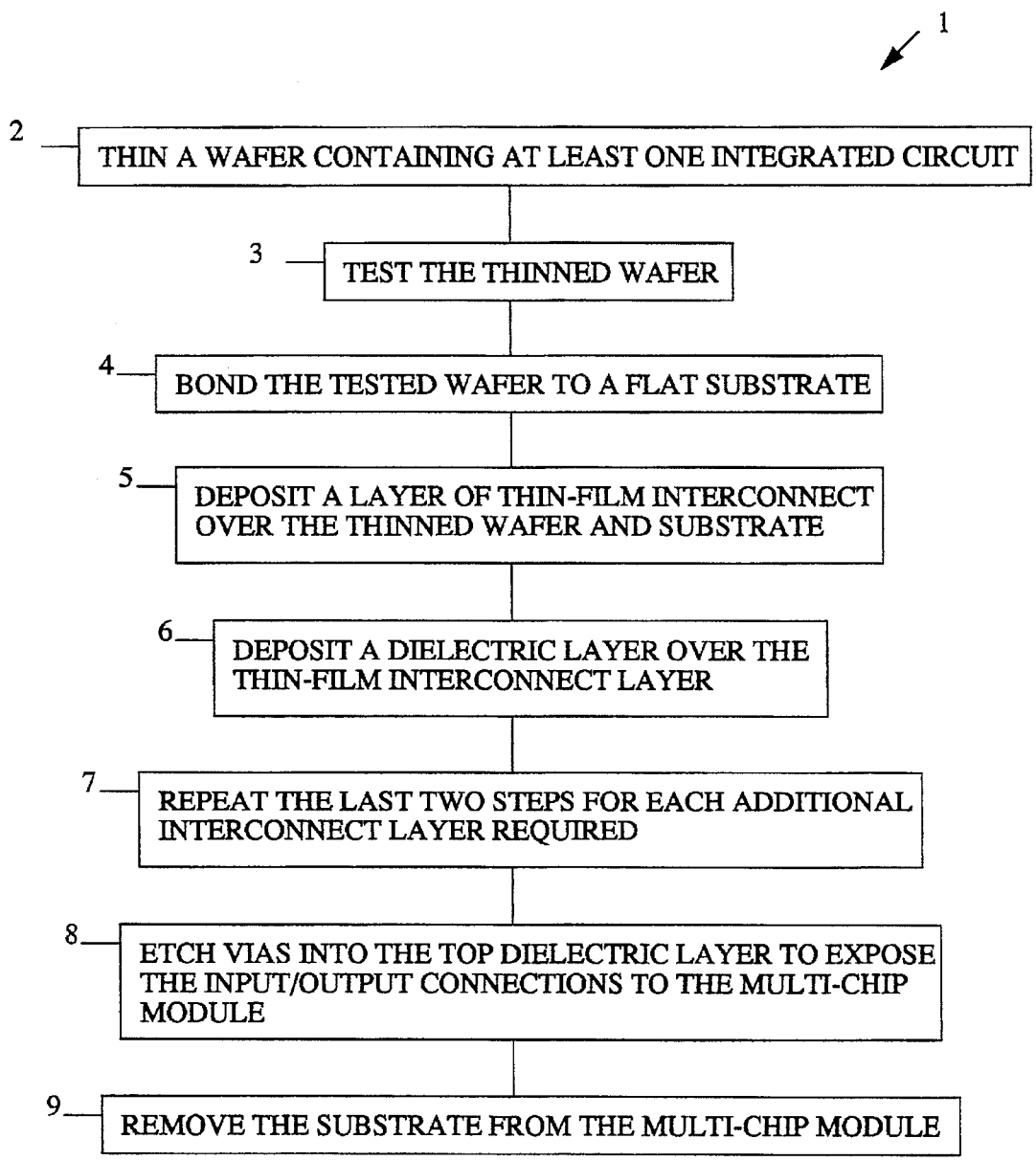
FIG. 1 is a list of steps of the method of the present invention.

The present invention is a method of making a thin, conformal, and high-yielding multi-chip module. FIG. 1 lists the steps 1 to the method of the present invention.

The first step 2 in the method is to make thin integrated circuits that will be used in the multi-chip module. The integrated circuits may exist individually on integrated circuit die, on a semiconductor wafer, or on a segment of a semiconductor wafer that contains multiple integrated circuits. The die, the wafer, or the wafer segment may be thinned using the thinning techniques disclosed below. It is preferred that individual die be thinned so that high performance commercially available die may be used in multi-chip modules produced by the present invention. It should be understood that the terms die, dice, and wafer are interchangeable in the present specification. The details of the wafer thinning process are described below.

By thinning the dice to a thickness less than or equal to 50 um, a planarization step required by prior art methods may be eliminated. A multi-chip module using such thin dice is sufficiently planar to directly accept subsequent processing layers. To reduce any defects due to step coverage (i.e., defects due to an interconnect layer having to cover too sharp of an angle) two techniques may be used. The first technique is to bevel the top of the dice by mechanical or chemical means to reduce the edge angles of the dice. The second technique is to put a dielectric layer over the dice and etch away, or etch back, the dielectric layer to the surface of the dice. In the second technique, dielectric material remains along the sides of the dice and provides a slope that is less abrupt than the sides of the dice. This less abrupt slope is easier to cover with an interconnect layer, resulting in fewer breaks in the interconnect layer covering the slope. Note that the dielectric layer in the second technique is not used for planarization but is used for improved step coverage. The dielectric material remaining at the sides of the dice is commonly referred to as a "spacer" and has been used by prior art methods as a mask layer for a subsequent deposition step.

Figure 2:
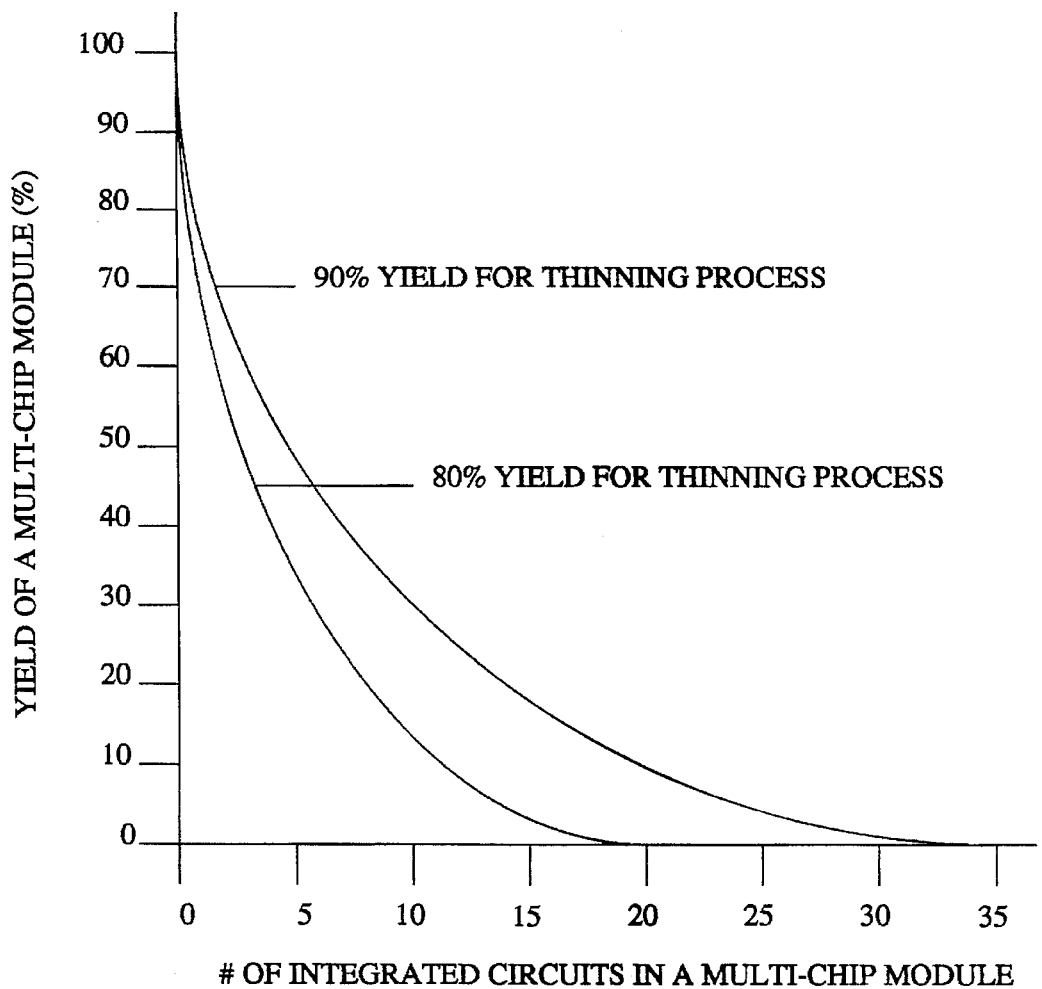
FIG. 2 is a chart of the yield for a multi-chip module.

The second step 3 in the method is to test the thinned dice. This step provides a substantial yield improvement over a method that thins a multi-chip module during one of the final steps in the manufacturing process. In the present invention, the dice are thinned in the first step in the method. Any yield loss that occurs during the thinning process will be detected at the subsequent testing step. Any damage to the dice is detected early in the method where it is less expensive to correct. If no other defect occurs, the present method achieves a 100% multi-chip module yield. A rule of thumb in manufacturing is that it is ten times more expensive to correct a defect at the next stage in the manufacturing process then it would be to correct a defect at the present stage. Presently, there is no way to repair a defective die at the multi-chip module stage. In other words, the present invention discards damaged die prior to making multi-chip modules while prior art methods do not. Therefore, prior art methods suffer yield loss at the more expensive multi-chip module level while the present invention suffers a yield loss at the less expensive dice level. FIG. 2 illustrates the manufacturing yield for a multi-chip module using different numbers of dice for two different thinning yields (i.e., 90% and 80%). For example, FIG. 2 illustrates that a method that thins a ten-dice multi-chip module after interconnection layers are deposited would experience a multi-chip module yield of approximately 35% if the thinning yield is 90% and no other defect occurred. In the present invention, defective thinned dice are discarded at the testing stage and only known good dice are built into the multi-chip module. The present invention does not employ a thinning step after the dice are built into the multi-chip module. Therefore, the present invention does not suffer from a yield loss due to the thinning process once the dice are built into the multi-chip module as does the prior art methods. Therefore, the multi-chip module yield for the present invention will be 100% if no other defect occurred.

As illustrated in FIG. 1, the third step 4 in the method is to bond the thinned dice to a substrate in a registered fashion so that the pads on the dice are in alignment with at least one subsequent thin-film interconnect layer. The substrate is preferably a thin flexible material such as mylar or polyimide. The substrate may be coated on one side with a dielectric layer. If present, the dielectric layer will be on the top side of the substrate on which die will be bonded. When the substrate is removed, the dielectric layer may be left attached to the dice or it may be removed with the substrate. The commercially available polyimide material KAPTON from E.I. du Pont de Neumors Company is suitable as the substrate material. The substrate may be a rigid material such as ceramic or semiconductor. Furthermore, a rigid second substrate may be used to mechanically support a thin flexible first substrate. In some applications it may be advantageous to form a conducting plane on the supporting substrate material using a conducting adhesive layer or metalized surface so that the backside electrodes of dice may be contacted when attached and the potential of the electrodes be established by use of the conducting plane.

The fourth step in the method is to deposit, laminate, or laser form a first layer of interconnect directly over the thinned dice. The interconnect layer may be deposited via thin-film techniques, laminated, or laser-formed. An adhesive may be used to attach the laminate layers. The first interconnect layer provides the substrate potential (i.e., ground or power) for the dice. Standard methods of depositing thin-film interconnect material may be used as well as recently developed laser techniques for applying interconnect. The laser techniques may provide better step coverage when the top edges of the thinned dice are not beveled (i.e., laser techniques for forming interconnect result in better interconnect adhesion over sharp angles). If the top edges of the thinned dice are beveled (i.e., angles are less sharp), then adequate step coverage may be achieved using standard thin-film interconnect deposition techniques that are less expensive and less complicated than laser techniques. The present invention does not require a dielectric layer prior to depositing the thin-film interconnect material because the passivation, or isolation, layer (e.g., silicon nitride) provides sufficient isolation between the interconnect layers on the dice and the interconnect layers. Prior art methods add a dielectric layer between the integrated circuits and the first layer of interconnect as part of a planarization step. The present invention does not require a planarization step because the topology resulting from the use of a dice thinned to a thickness of less than or equal to 50 um is sufficiently planar to accept at least one subsequently deposited interconnect layer. The planarization methods employed by the prior art include (1) wells in the substrate into which standard-thickness integrated circuits are placed, where any remaining space is filled with a dielectric material, or (2) bonding standard-thickness integrated circuits directly to a substrate, depositing a dielectric material over both the integrated circuits and the substrate, and smoothing the dielectric layer.

In an alternate embodiment, two steps may be performed before the fourth step 5. That is, a dielectric layer may be deposited over the dice and etched away, or etched back, to the surface of the dice. The result is dielectric material remaining along the sides of the dice that provides a slope that is less abrupt than the sides of the dice. This less abrupt slope is easier to cover with an interconnect layer. Note that the deposited dielectric layer is not used for planarization but is used for improved step coverage.

The fifth step 6 in the method is to deposit a dielectric layer over the first layer of thin-film interconnect. Standard methods of depositing dielectric material may be used.

The sixth step 7 is to open vias in the dielectric layer so that the first interconnect layer may be contacted. Steps four, five and six are repeated 8 for each additional interconnect layer required. The top layer of via cuts allow contact to the resulting multi-chip module.

The final step 9 in the method is to remove the substrate on which the thinned dice are bonded. The thinnest, most conformal multi-chip module is achieved by using thin dice, depositing a first layer of interconnect directly over the dice, depositing a dielectric layer for each layer of interconnect required, cutting vias in the dielectric layers where appropriate, depositing interconnect layers as required, and removing the substrate after vias are cut in the final dielectric layer deposited. High manufacturing yield is achieved by testing the dice after being thinned and prior to being built into a multi-chip module. Defective dice are discarded at an early, and relatively inexpensive, stage in the process. The multi-chip module is then constructed using only known good dice. Prior art methods that thin the multi-chip module in one of the final steps in the process will suffer a yield loss due to the thinning process. The present invention avoids this yield loss.

Figure 3:
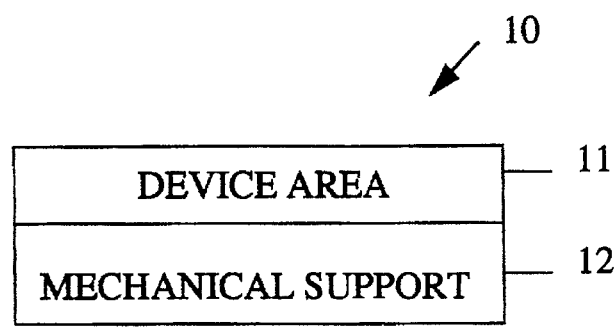
FIGS. 3–9 is a series of progressive side-views of a multi-chip module resulting from the method of the present invention.

FIG. 3 is a side view of a standard thickness die 10. The die 10 has a thin upper region 11 which contains electronic circuitry and a thick lower region 12 for mechanical support during the fabrication of the circuitry. After the circuitry is fabricated, the thick lower region 12 is no longer needed. The die 10 shown in FIG. 3 is not beveled, but the present invention may use beveled die in order to reduce any yield loss due to poor step coverage. The present invention may also include a step where unbeveled dice are beveled after the unbeveled dice are bonded to the substrate.

Figure 4:
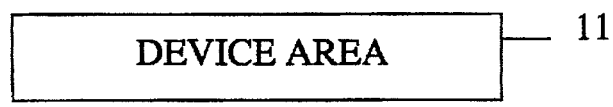

FIG. 4 is a side view of the thinned die 11 (i.e., the thin upper region of the wafer 10 of FIG. 3). The lower region 12 is removed during the thinning process. The steps of the thinning process will be described below. The thinned die 11 is thinned to less than or equal to 50 um.

Figure 5:
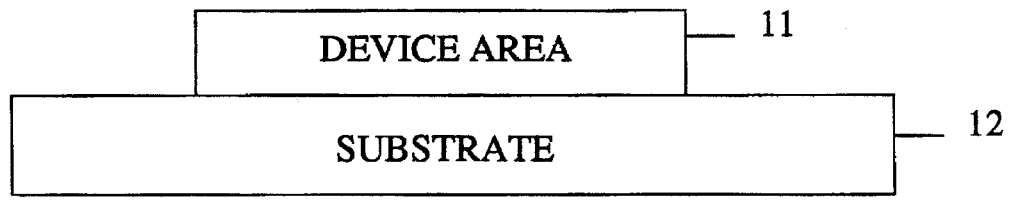

FIG. 5 is a side view of multiple thinned dice 11 bonded to a substrate 13. The substrate 13 may be a rigid material such as ceramic or semiconductor, or the substrate 13 may be a thin flexible material such as polyimide or mylar. Polyimide is commercially available from du Pont as KAPTON. A ceramic or semiconductor substrate 13 may be coated with polyimide or mylar.

Figure 6:
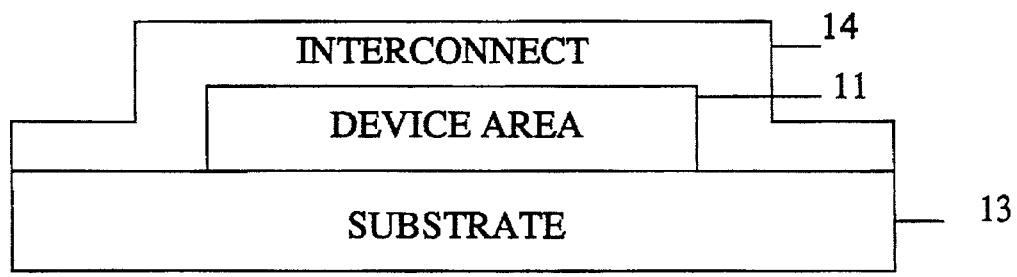

FIG. 6 is a side view of the developing multi-chip module showing a first layer of thin-film interconnect 14 deposited directly over the thinned dice 11 and the substrate 13. The present invention does not require a planarization step because the topology of the present invention is sufficiently planar to accept subsequent deposition layers. Prior art methods that use standard-thickness dice require a planarizing dielectric layer between the dice and the first thin-film interconnect layer. The interconnect layer in the present invention may be deposited using three known techniques (i.e., a standard deposition technique, a more complicated and more expensive laser metal deposition technique, and a pre-fabricated laminate interconnect technique). The laser technique for forming interconnect layers may provide better step coverage. In the pre-fabricated laminate interconnect technique, pre-existing laminate interconnect layers are attached to the dice by an adhesive and electrically connected by laser drilling and plating.

Figure 7:
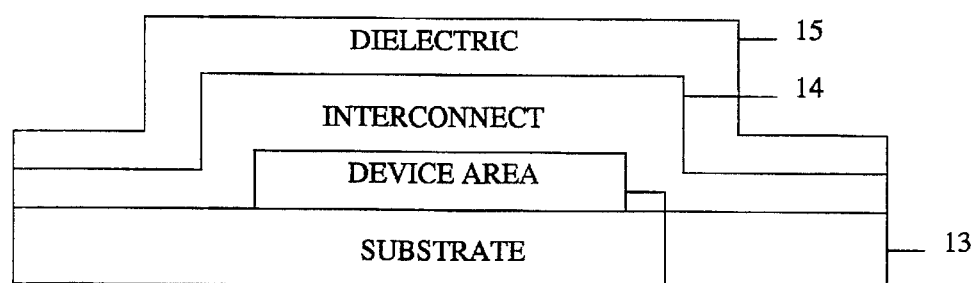

FIG. 7 is a side view of the developing multi-chip module showing a dielectric layer 1deposited over the first interconnect layer 14. The dielectric layer 1acts as an insulation layer between any other interconnect layer that may be deposited or as a protective layer if it is the last layer of the multi-chip module. If more than one interconnect layer is used, appropriate vias, or openings, are made in the dielectric layers in order to realize the multi-layer interconnect scheme desired.

Figure 8:
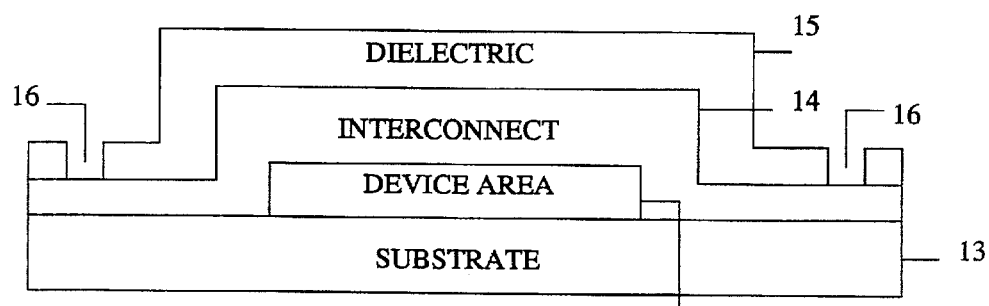

FIG. 8 is a side view of the developing multi-chip module showing vias 16 that are cut into the top dielectric layer of the multi-chip module. For simplification, only one interconnect layer 14 and one dielectric layer 1is shown. It should be understood that any number of interconnect layers and dielectric layers may be deposited. The vias 16 allow contact to the interconnect layers and the multi-chip module.

Figure 9:
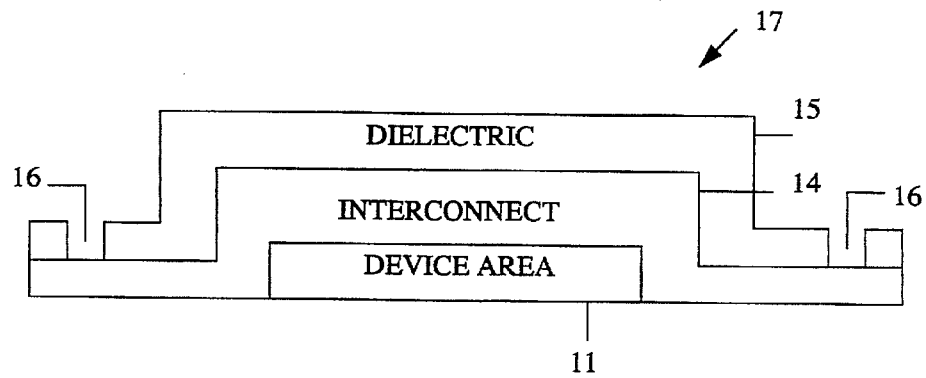

FIG. 9 is a side view of the resulting multi-chip module showing the absence of the substrate 13. The substrate 13 may be removed using reactive ion etchants, wet or dry chemically etchants, mechanical grinding, a release layer, or a combination thereof. The resulting combination of thinned dice 11, a thin-film interconnect layer 14, and a dielectric layer 15 forms a thin, conformal, and high-yielding multi-chip module 17.

Figure 10:
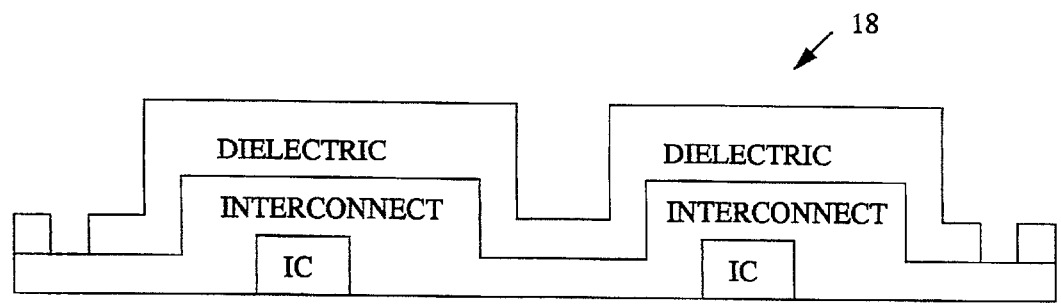
FIG. 10 is a side view of a multi-chip module of the present invention that uses more than one die.

FIG. 10 illustrates a multi-chip module of the present invention that uses multiple integrated circuits.

Figure 11:
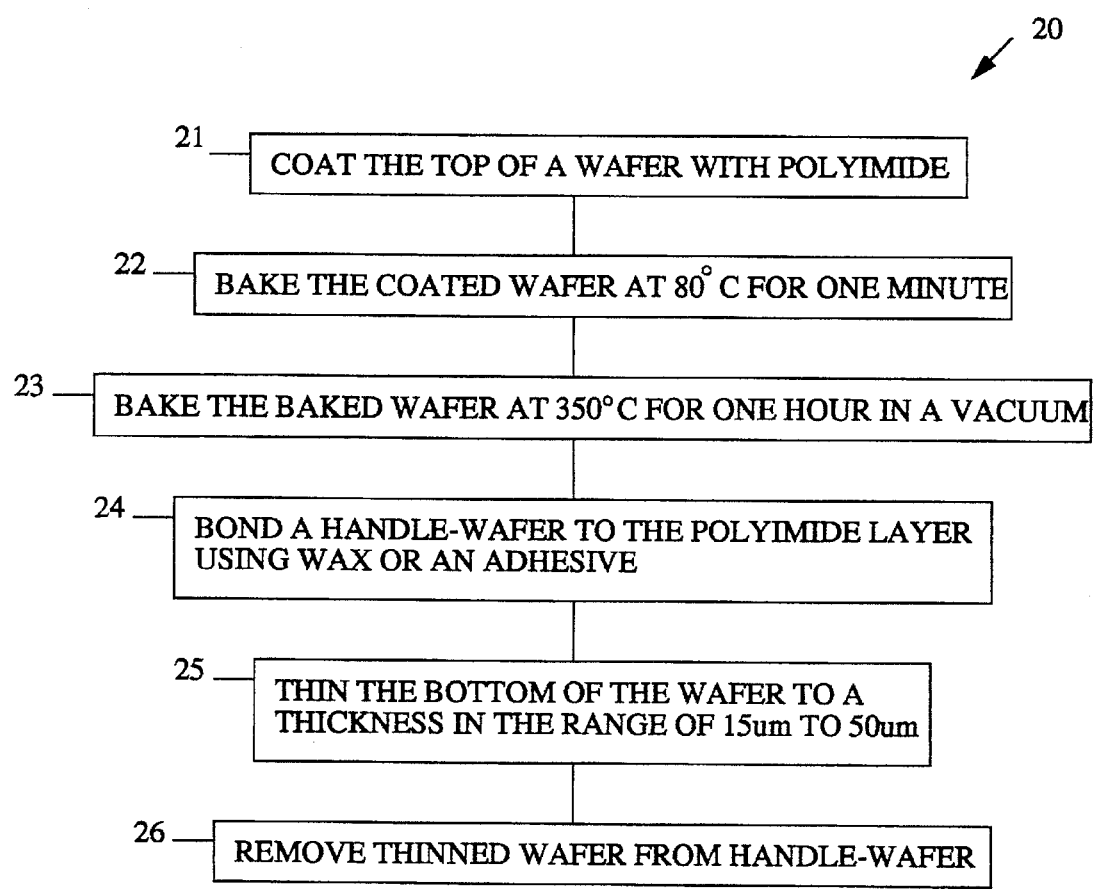
FIG. 11 is a list of steps for thinning a die.

FIG. 11 illustrates the method 20 of thinning a die (or wafer). The first step 21 is to coat the top of the die with a polyimide material. The second step 22 is to cure the coated die at 80° C. for one minute to drive off solvents. The third step 23 is to cure the die again at 350° C. for one hour in a vacuum. The fourth step 24 is to bond a handle-wafer to the polyimide layer using wax or an adhesive. The fifth step 25 is to thin the die from the bottom to a thickness of less than or equal to 50 um using reactive ion etchants, wet chemical etchants, dry chemical etchants, mechanical grinding, or a combination thereof. The sixth, and final, step 26 in the process is to release the thinned die from the handle by melting the wax, dissolving the adhesive, or chemically etching away the sacrificial substrate. Transfers to other handle wafers for transportation of thinned die prior to use in a multi-chip module may be achieved using the adhesive and release steps mentioned above.

Figure 12:
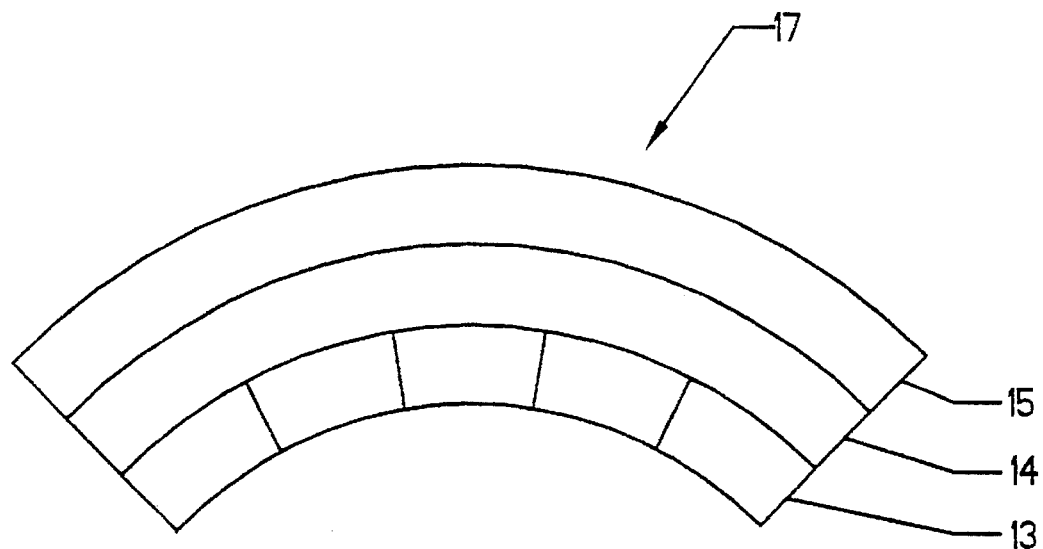
FIG. 12 and 13 illustrate that butted thinned die flex in a multi-chip module of the present invention.
Figure 13:
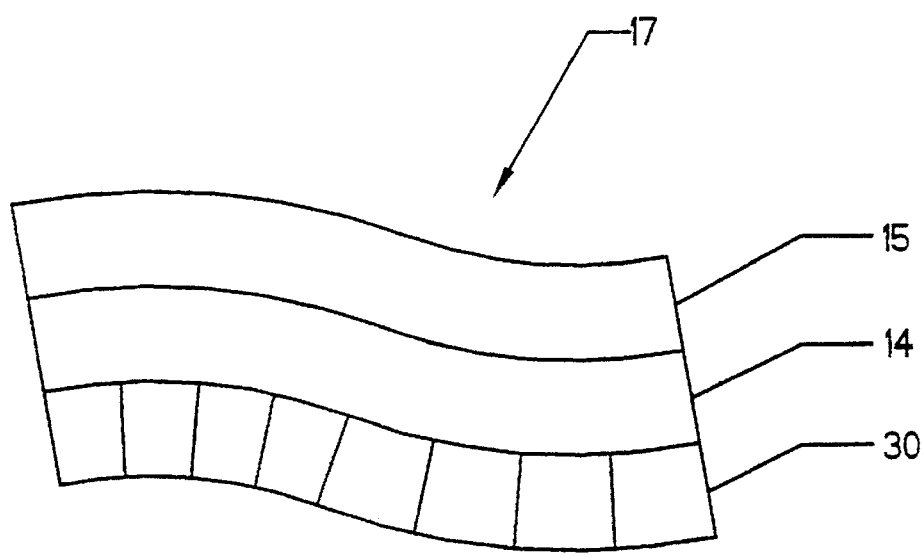

FIG. 12 and FIG. 13 illustrates multi-chip modules 17 of the present invention that uses thinned dice 30 that are butted together. The dice may even overlap each other for even denser packing. After these dice 30 are covered with an interconnect layer 14 and a dielectric layer 15, they flex to conform to irregular surfaces (not shown but indicated by the flexing in FIGS. 12 and 13). In the prior art, conformal multi-chip modules flex at the joints between the dice. The present invention allows for the manufacture of multi-chip modules that are more area efficient than the prior art. The thinner the dice, the smaller the radius of curvature which can be achieved without circuit failure. Similarly, thinner layers of interconnect will allow a smaller radius of curvature to be achieved without circuit failure. The present invention may be used to make a substrateless multi-chip module having two levels of metal interconnect, and having a thickness of less than 50 um. It is believed that such a multi-chip module may be flexed repeatedly without failure.

What is claimed is:

1. A method of making a multi-chip module, comprising the steps of:

a) thinning at least one integrated circuit to a thickness of less than or equal to 50 um, where the at least one integrated circuit has a circuit side and a backside;

b) testing the thinned at least one integrated circuit;

c) bonding the tested at least one thinned integrated circuit to a bonding substrate;

d) putting a layer of interconnect material directly over the at least one thinned integrated circuit and the bonding substrate;

e) putting a dielectric layer over said interconnect layer;

f) opening vias in said dielectric layer;

g) repeating steps (d), (e), and (f) for each additional interconnect layer required; and h) removing the bonding substrate to form a multi-chip module.

2. The method of claim 1, wherein said step of thinning at least one integrated circuit comprises the steps of:
   a) coating the circuit side of the at least one integrated circuit with polyimide;
   b) curing the coated at least one integrated circuit a first time at a temperature of 80° C. for one minute;
   c) curing the coated at least one integrated circuit a second time at 350° C. for one hour in a vacuum;
   d) bonding a handle-wafer to the polyimide layer coated to the circuit side of the at least one integrated circuit;.
   e) thinning the at least one integrated circuit from the backside of the at least one integrated circuit to a thickness of less than or equal to 50 um; and
   f) removing the thinned at least one integrated circuit from the handle-wafer.

3. The method of claim 1, wherein said step of thinning at least one integrated circuit comprises the steps of:
   a) bonding the at least one integrated circuit side down to a first supporting substrate in a registered fashion so that the at least one integrated circuit may be positionally identified;
   b) surrounding the at least one integrated circuit with a suitable material;
   c) thinning the at least one integrated circuit from the backside to a thickness of less than or equal to 50 um;
   d) making electrical contact to the backside of the at least one integrated circuit as required;
   e) bonding a second supporting substrate to the backside of the thinned at least one integrated circuit in order to create a three layer stack; and
   f) removing the first supporting substrate.

4. The method of claim 3, wherein said step of surrounding the at least one integrated circuit is comprised of surrounding the at least one integrated circuit with a material selected from the group consisting of hard wax, epoxy, bisbenzocyclobutene resin, polyimide, and acrylic.

5. The method of claim 4, wherein said step of thinning the at least one integrated circuit is comprised of thinning the at least one integrated circuit by a thinning technique selected from the group consisting of mechanical grinding, lapping, polishing, wet chemical etching, dry chemical etching, sputter removal, and a combination thereof.

6. The method of claim 5, wherein said step of removing the first supporting substrate is comprised of removing the first supporting substrate by a removal technique selected from the group consisting of mechanical grinding, lapping, polishing, wet chemical etching, dry chemical etching, sputter removal, and a combination thereof.

7. The method of claim 2, wherein said step of thinning the at least one integrated circuit from the backside of the at least one integrated circuit to a thickness of less than or equal to 50 um is comprised of thinning the at least one integrated circuit from the backside of the at least one integrated circuit to a thickness of less than or equal to 50 um where said at least one integrated circuit is backside processed to form a backside electrode.

8. The method of claim 1, wherein said step of thinning at least one integrated circuit is comprised of thinning at least one integrated circuit where the at least one integrated circuit is selected from the group consisting of an unbeveled integrated circuit die, a beveled integrated circuit die, an unbeveled integrated circuit wafer, a beveled integrated circuit wafer, a segment of an unbeveled integrated circuit wafer, and a segment of a beveled integrated circuit wafer.

9. The method of claim 1, further comprising the step of beveling any unbeveled at least one integrated circuit after the at least one integrated circuit is bonded to the bonding substrate and before the interconnect layer is put on the at least one integrated circuit.

10. The method of claim 1, wherein said step of bonding the tested at least one thinned integrated circuit to a bonding substrate is comprised of bonding the tested at least one thinned integrated circuit to a bonding substrate wherein said bonding substrate is selected from the group consisting of polyimide, mylar, ceramic, and semiconductor.

11. The method of claim 1, wherein said step of bonding the tested at least one thinned integrated circuit to a bonding substrate is comprised of bonding the tested at least one thinned integrated circuit to a bonding substrate selected from the group consisting of a bonding substrate coated with a conducting material to provide electrical contact to a backside electrode of the tested at least one thinned integrated circuit and a bonding substrate coated with a dielectric material.

12. The method of claim 1, wherein said step of putting a layer of interconnect material directly over the at least one thinned integrated circuit and bonding substrate is comprised of putting a layer of interconnect material directly over the at least one thinned integrated circuit using a technique selected from the group consisting of depositing an interconnect layer, laser forming an interconnect layer, and laminating a pre-formed interconnect layer.

13. The method of claim 1, wherein said step of putting a layer of dielectric material over the interconnect layer is comprised of putting a layer of dielectric material over the interconnect layer using a technique selected from the group consisting of depositing dielectric material, laser forming dielectric material, and laminating pre-formed dielectric material.

14. The method of claim 1, wherein said step of bonding the tested at least one integrated circuit to a bonding substrate comprises bonding at least two tested integrated circuits to a bonding substrate.

15. The method of claim 14, wherein said step of bonding at least two tested integrated circuits to a bonding substrate comprises bonding the at least two tested integrated circuits to a bonding substrate using a technique selected from the group consisting of butting the at least two tested integrated circuits together and overlapping the at least two tested integrated circuits.

16. The method of claim 1, wherein said step of removing the bonding substrate to form a multi-chip module is comprised of removing the bonding substrate using a removal technique selected from the group consisting of reactive ion etching, dry chemical etching, wet chemical etching, mechanical grinding, using a release layer, and any combination thereof.

17. The method of claim 7, wherein said step of removing the thinned at least one die from the handle-wafer is comprised of removing the thinned at least one integrated circuit using a removal technique selected from the group consisting of reactive ion etching, dry chemical etching, wet chemical etching, mechanical grinding, using a release layer, and any combination thereof.

18. The method of claim 17, wherein said step of thinning at least one integrated circuit is comprised of thinning at least one integrated circuit where the at least one integrated circuit is selected from the group consisting of an unbeveled integrated circuit die, a beveled integrated circuit die, an unbeveled integrated circuit wafer, a beveled integrated circuit wafer, a segment of an unbeveled integrated circuit wafer, and a segment of a beveled integrated circuit wafer.

19. The method of claim 18, further comprising the step of beveling any unbeveled at least one integrated circuit after the at least one integrated circuit is bonded to the bonding substrate and before the interconnect layer is put on the at least one integrated circuit.

20. The method of claim 19, wherein said step of bonding the tested at least one thinned integrated circuit to a bonding substrate is comprised of bonding the tested at least one thinned integrated circuit to a bonding substrate wherein said bonding substrate is selected from the group consisting of polyimide, mylar, ceramic, and semiconductor.

21. The method of claim 20, wherein said step of bonding the tested at least one thinned integrated circuit to a bonding substrate is comprised of bonding the tested at least one thinned integrated circuit to a bonding substrate selected from the group consisting of a bonding substrate coated with a conducting material to provide electrical contact to a backside electrode of the tested at least one thinned integrated circuit and a bonding substrate coated with a dielectric material.

22. The method of claim 21, wherein said step of putting a layer of interconnect material directly over the at least one thinned integrated circuit and bonding substrate is comprised of putting a layer of interconnect material directly over the at least one thinned integrated circuit using a technique selected from the group consisting of depositing an interconnect layer, laser forming an interconnect layer, and laminating a pre-formed interconnect layer.

23. The method of claim 22, wherein said step of putting a layer of dielectric material over the interconnect layer is comprised of putting a layer of dielectric material over the interconnect layer using a technique selected from the group consisting of depositing dielectric material, laser forming dielectric material, and laminating pre-formed dielectric material.

24. The method of claim 23, wherein said step of removing the bonding substrate to form a multi-chip module is comprised of removing the bonding substrate using a removal technique selected from the group consisting of reactive ion etching, dry chemical etching, wet chemical etching, mechanical grinding, using a release layer, and any combination thereof.

25. A method of making a multi-chip module, comprising the steps of:
  a) thinning at least one integrated circuit to a thickness of less than or equal to 50 um, where the at least one integrated circuit has a circuit side and a backside;
  b) testing the thinned at least one integrated circuit;
  c) bonding the tested at least one thinned integrated circuit to a bonding substrate;
  d) putting a dielectric layer over said at least one thinned integrated circuit;
  e) etching the dielectric layer to the surface of the at least one integrated circuit so that dielectric material remains along the edge of the at least one integrated circuit for rounding the edges of the at least one integrated circuit;
  f) putting a layer of interconnect material over the at least one integrated circuit and dielectric layer at the edge of the at least one integrated circuit;
  g) putting a dielectric layer over the interconnect layer;
  h) repeating steps (f) and (g) for each additional interconnect layer required; and
  i) removing the bonding substrate to form a multi-chip module.

26. The method of claim 25, wherein said step of thinning at least one integrated circuit comprises the steps of:
  a) coating the circuit side of the at least one integrated circuit with polyimide;
  b) curing the coated at least one integrated circuit a first time at a temperature of 80° C. for one minute;
  c) curing the coated at least one integrated circuit a second time at 350° C. for one hour in a vacuum;
  d) bonding a handle-wafer to the polyimide layer coated to the circuit side of the at least one integrated circuit;
  e) thinning the at least one integrated circuit from the backside of the at least one integrated circuit to a thickness of less than or equal to 50 um; and
  f) removing the thinned at least one integrated circuit from the handle-wafer.

27. The method of claim 25, wherein said step of thinning at least one integrated circuit comprises the steps of:
  a) bonding the at least one integrated circuit circuit side down to a first supporting substrate in a registered fashion so that the at least one integrated circuit may be positionally identified;
  b) surrounding the at least one integrated circuit with a suitable material;
  c) thinning the at least one integrated circuit from the backside to a thickness of less than or equal to 50 um;
  d) making electrical contact to the backside of the at least one integrated circuit as required;
  e) bonding a second supporting substrate to the backside of the thinned at least one integrated circuit in order to create a three layer stack; and
  f) removing the first supporting substrate.

28. The method of claim 27, wherein said step of surrounding the at least one integrated circuit is comprised of surrounding the at least one integrated circuit with a material selected from the group consisting of hard wax, epoxy, bisbenzocyclobutene resin, polyimide, and acrylic.

29. The method of claim 28, wherein said step of thinning the at least one integrated circuit is comprised of thinning the at least one integrated circuit by a thinning technique selected from the group consisting of mechanical grinding, lapping, polishing, wet chemical etching, dry chemical etching, sputter removal, and a combination thereof.

30. The method of claim 29, wherein said step of removing the first supporting substrate is comprised of removing the first supporting substrate by a removal technique selected from the group consisting of mechanical grinding, lapping, polishing, wet chemical etching, dry chemical etching, sputter removal, and a combination thereof.

31. The method of claim 26, wherein said step of thinning the at least one integrated circuit from the backside of the at least one integrated circuit to a thickness of less than or equal to 50 um is comprised of thinning the at least one integrated circuit from the backside of the at least one integrated circuit to a thickness of less than or equal to 50 um where said at least one integrated circuit is backside processed to form a backside electrode.

32. The method of claim 25, wherein said step of thinning at least one integrated circuit is comprised of thinning at least one integrated circuit where the at least one integrated circuit is selected from the group consisting of an unbeveled integrated circuit die, a beveled integrated circuit die, an unbeveled integrated circuit wafer, a beveled integrated circuit wafer, a segment of an unbeveled integrated circuit wafer, and a segment of a beveled integrated circuit wafer.

33. The method of claim 25, further comprising the step of beveling any unbeveled at least one integrated circuit after the at least one integrated circuit is bonded to the bonding substrate and before the interconnect layer is put on the at least one integrated circuit.

34. The method of claim 25, wherein said step of bonding the tested at least one thinned integrated circuit to a bonding substrate is comprised of bonding the tested at least one thinned integrated circuit of step (b) to a bonding substrate wherein said bonding substrate is selected from the group consisting of polyimide, mylar, ceramic, and semiconductor.

35. The method of claim 25, wherein said step of bonding the tested at least one thinned integrated circuit to a bonding substrate is comprised of bonding the tested at least one thinned integrated circuit to a bonding substrate selected from the group consisting of a bonding substrate coated with a conducting material to provide electrical contact to a backside electrode of the tested at least one thinned integrated circuit and a bonding substrate coated with a dielectric material.

36. The method of claim 25, wherein said step of putting a layer of interconnect material over the at least one integrated circuit and dielectric material at the edge of the at least one integrated circuit is comprised of putting a layer of interconnect material over the at least one integrated circuit and dielectric material at the edge of the at least one integrated circuit using a technique selected from the group consisting of depositing an interconnect layer, laser forming an interconnect layer, and laminating a pre-formed interconnect layer.

37. The method of claim 25, wherein said step of putting a layer of dielectric material over the interconnect layer is comprised of putting a layer of dielectric material over the interconnect layer using a technique selected from the group consisting of depositing dielectric material, laser forming dielectric material, and laminating pre-formed dielectric material.

38. The method of claim 25, wherein said step of bonding the tested at least one integrated circuit to a bonding substrate comprises bonding at least two tested integrated circuits to a bonding substrate.

39. The method of claim 38, wherein said step of bonding at least two tested integrated circuits to a bonding substrate comprises bonding the at least two tested integrated circuits to a bonding substrate using a technique selected from the group consisting of butting the at least two tested integrated circuits together and overlapping the at least two tested integrated circuits.

40. The method of claim 25, wherein said step of removing the bonding substrate to form a multi-chip module is comprised of removing the bonding substrate using a removal technique selected from the group consisting of reactive ion etching, dry chemical etching, wet chemical etching, mechanical grinding, using a release layer, and any combination thereof.

41. The method of claim 31, wherein said step of removing the thinned at least one integrated circuit from the handle-wafer is comprised of removing the thinned at least one integrated circuit using a removal technique selected from the group consisting of reactive ion etching, dry chemical etching, wet chemical etching, mechanical grinding, using a release layer, and any combination thereof.

42. The method of claim 41, wherein said step of thinning at least one integrated circuit is comprised of thinning at least one integrated circuit where the at least one integrated circuit is selected from the group consisting of an unbeveled integrated circuit die, a beveled integrated circuit die, an unbeveled integrated circuit wafer, a beveled integrated circuit wafer, a segment of an unbeveled integrated circuit wafer, and a segment of a beveled integrated circuit wafer.

43. The method of claim 42, further comprising the step of beveling any unbeveled at least one integrated circuit after the at least one integrated circuit is bonded to the bonding substrate and before the interconnect layer is put on the at least one integrated circuit.

44. The method of claim 42, wherein said step of bonding the tested at least one thinned integrated circuit to a bonding substrate is comprised of bonding the tested at least one thinned integrated circuit of step (b) to a bonding substrate wherein said bonding substrate is selected from the group consisting of polyimide, mylar, ceramic, and semiconductor.

45. The method of claim 44, wherein said step of bonding the tested at least one thinned integrated circuit to a bonding substrate is comprised of bonding the tested at least one thinned integrated circuit to a bonding substrate selected from the group consisting of a bonding substrate coated with a conducting material to provide electrical contact to a backside electrode of the tested at least one thinned integrated circuit and a bonding substrate coated with a dielectric material.

46. The method of claim 45, wherein said step of putting a layer of interconnect material over the at least one integrated circuit and dielectric material at the edge of the at least one integrated circuit is comprised of putting a layer of interconnect material over the at least one integrated circuit and dielectric material at the edge of the at least one integrated circuit using a technique selected from the group consisting of depositing an interconnect layer, laser forming an interconnect layer, and laminating a pre-formed interconnect layer.

47. The method of claim 46, wherein said step of putting a layer of dielectric material over the interconnect layer is comprised of putting a layer of dielectric material over the interconnect layer using a technique selected from the group consisting of depositing dielectric material, laser forming dielectric material, and laminating pre-formed dielectric material.

48. The method of claim 46, wherein said step of removing the bonding substrate to form a multi-chip module is comprised of removing the bonding substrate using a removal technique selected from the group consisting of reactive ion etching, dry chemical etching, wet chemical etching, mechanical grinding, using a release layer, and any combination thereof.

* * * * *